Figure 1:
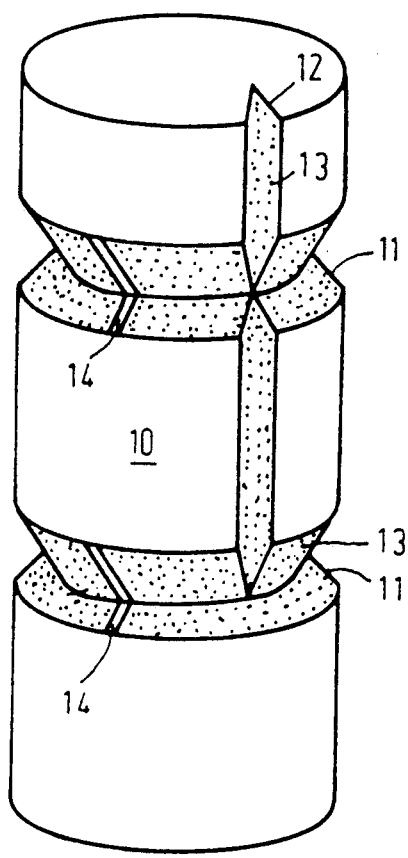

United States Patent [19]

Dössel et al.

[11] Patent Number: 5,049,818

[45] Date of Patent: Sep. 17, 1991

[54] GRADIOMETER FOR DETECTING WEAK MAGNETIC FIELDS INCLUDING GROOVES CARRYING SUPERCONDUCTING THIN FILM CONDUCTORS AND METHOD OF MAKING SAME

[75] Inventors: Olaf Dössel, Tangstedt; Wilfried Edeler, Hamburg, both of Fed. Rep. of Germany

[73] Assignee: U.S. Philips Corporation, New York, N.Y.

[21] Appl. No.: 489,423

[22] Filed: Mar. 5, 1990

[30] Foreign Application Priority Data

Mar. 4, 1989 [DE] Fed. Rep. of Germany ....... 3906981

[51] Int. Cl.$^5$ ............................................. G01R 33/035
[52] U.S. Cl. ................................... 324/248; 505/846; 427/62; 427/35; 336/84 M; 336/DIG. 1
[58] Field of Search ........... 324/248; 336/84 R, 84 C, 336/84 M, 208, 180, 185, DIG. 1; 505/845, 842, 843, 846; 427/35, 62, 63

[56] References Cited

U.S. PATENT DOCUMENTS

| | | | |
|---|---|---|---|
| 4,280,095 | 7/1981 | Hinton | 324/248 |
| 4,437,064 | 3/1984 | Overton, Jr. et al. | 324/248 X |
| 4,523,147 | 6/1985 | D'Angelo et al. | 324/248 |

FOREIGN PATENT DOCUMENTS 0111827 12/1983 European Pat. Off. .
0184670 6/1985 European Pat. Off. .
0185186 6/1985 European Pat. Off. .

OTHER PUBLICATIONS

John Clarke, "Principles and Applications of SQUIDs", Proceedings of the IEEE, vol. 77, No. 8, Aug. 1989, pp. 1208-1223.

Primary Examiner—Kenneth A. Wieder
Assistant Examiner—Warren S. Edmonds
Attorney, Agent, or Firm—William Squire

[57] ABSTRACT

A superconducting gradiometer for measuring weak magnetic fields for a measuring device comprising a SQUID (Superconductive Quantum Interference Devices), a gradiometer coil, a coupling coil, a cryosystem and a signal processing device, in which the well-defined gradient of a magnetic field to be measured is detected by means of the gradiometer. A coil of the gradiometer is made of superconducting wire, arranged about a carrier body in axial and circumferential grooves cut in the carrier body, the grooves being coated with a superconducting thin film. The thin film in the circumferential grooves is interrupted by slots. The wire in the respective circumferential grooves comprises loops wound in opposing directions connected by a twisted pair of connecting leads secured in the axial groove.

13 Claims, 1 Drawing Sheet

GRADIOMETER FOR DETECTING WEAK MAGNETIC FIELDS INCLUDING GROOVES CARRYING SUPERCONDUCTING THIN FILM CONDUCTORS AND METHOD OF MAKING SAME

The invention relates to a superconducting gradiometer for measuring weak magnetic fields for a measuring device comprising a coupling coil which is connected to a gradiometer and a SQUID in a cryosystem and a processing device, and to a method of manufacturing the gradiometer for measuring weak magnetic fields for a measuring device comprising a coupling coil connected to the gradiometer and a SQUID in a cryosystem and a processing device.

SQUIDs (Superconducting Quantum Interference Devices) are used to measure weak magnetic fields having a field intensity in the range below $10^{-10}$ T. They are used as measuring sensors, for example, in the medical technology to measure the magnetic fields of the heart (magneto-cardiography) or of the brain (magneto-encephalography) or also for liver diagnostics (liver susceptometry). A suitable measuring device for these weak magnetic fields comprises, in addition to a SQUID, a gradiometer, a coupling coil and a processing device. The gradiometer, the coupling coil and the SQUID are arranged together in a cryosystem which ensures that the temperature necessary for superconductivity is attained. The gradiometer comprises a coil which detects the magnetic field to be measured and which forms a closed superconducting circuit together with the coupling coil. By means of said coupling coil the measured magnetic field is transformed in the SQUID.

The gradiometers essentially serve to render the measuring system substantially insensitive to uniform magnetic fields. For example, using gradiometers nonuniform fields can be measured which are many orders of magnitude smaller than the uniform magnetic field of the earth. Moreover, by means of higher-order gradiometers disturbing signals from more distant sources can be suppressed relative to signals originating from nearby sources. The quality of a gradiometer essentially depends on the extent to which it can be made insensitive to undesirable field components or gradients. The measurement of the gradient instead of the actual field should not lead to a loss of essential information about the source of the magnetic field. To measure the z-components of a nonuniform field, for example, the gradients in three spatial directions $dB_z/dz$, $dB_z/dx$, $dB_z/dy$ can be used. Relative to mixed gradients the gradient in the z-direction requires a three-dimensional coil system. A gradiometer for $dB_z/dz$ is adjusted when it is insensitive with regard to the field components $B_x$, $B_y$ and $B_z$ and the field gradients $dB_z/dy$ and $dB_z/dx$. A measure of the adjustment with respect to the three field components is the quotient of the displayed apparent field difference in the z-direction and the strength of the relevant uniform field $B_z/B_z$, $B_z/B_x$, $\Delta B_z/B_y$ which is present each time. For biomagnetic applications, adjustment values better than $10^{-4}$ are aimed at.

For such applications, gradiometers having at least one turn of wire are known according to the state of the art. Such gradiometers generally comprise a carrier having very accurate grooves in which the wire is accommodated. Despite the fact that the wire, which has a typical diameter of approximately 0.1 mm, is accurately accommodated in the grooves and cemented thereto, these gradiometers can be adjusted to only approximately 1% because the wire cannot be arranged with sufficient precision at, amongst others, the bends at the location of the connection wires, and because of the not fully corresponding coefficients of thermal expansion of the materials used and the large temperature differences between manufacture and operation which cannot be maintained with sufficient precision. When, viewed from the x-direction of such a $dB_z/dz$ gradiometer, a small area surrounded by wire is detected, while, for example, two turns do not run parallel, this results in a misadjustment $\Delta B_z/B_x$. When, viewed in the z-direction of such a gradiometer, an area surrounded by wire in a turn which is not fully covered by another turn is detected, this brings about a misadjustment $\Delta B_z/B_z$. Further, techniques are known by means of which a gradiometer can be subsequently adjusted using superconducting and normal conducting chips, however, these techniques are unsuitable for multichannel juxtaposed gradiometers because the adjustment of one channel leads to the misadjustment of the neighbouring channels.

The above adjustment problems have led to thin-film gradiometers which generally have the additional advantage that they can be subsequently adjusted even more accurately by means of a laser, and that the adjustment thus obtained is preserved also after a number of thermal cycles. The desirable adjustment value of $10^{-4}$ is obtained immediately after the manufacture. As such known planar arrangements enable mixed gradients to be realised, they are probably unsuitable for use in the field of biomagnetics because they do not supply the information about the field which is necessary for a reconstruction of neuronal sources. Suitable three-dimensional $dB_z/dz$ gradiometers, based on methods used in the thin-film technology, which are suitable for multichannel measuring systems are known from, for example, European Patent Applications 0 184 670, 0 185 186, 0 111 827 and U.S. Pat. No. 4,280,095.

In the two first mentioned European Patent Applications it is proposed to provide the coil turns on a flexible foil by means of the thin-film technology, after which they are given the desirable three-dimensional form. However, there is a risk that the flexible foil cannot be cemented with sufficient precision and that it does not remain dimensionally stable during cooling owing to the large coefficient of thermal expansion of adhesives. In the third European Patent Application, a description is given of a method which enables a thin-film strip to be manufactured around the edge of a cube, thus forming a three-dimensional gradiometer on the side faces of a cube. In this connection it should be taken into account that it is very difficult to provide a pattern on non-standardised substrates (silicon plates). In the above-mentioned U.S. Patent a description is given of a very sensitive SQUID which is constructed as a double coil. Using thin-film technology, superconducting turns and the Josephson contacts of a SQUID themselves, are formed in grooves in the surface of a non-conducting carrier body. To enable, inter alia, a contact-free crossing of several turns, a costly multiple coating process using superconducting thin film and non conducting material is required. With respect to the desirable adjustment, said coating operations must be carried out very accurately and, consequently, they require much technical expenditure. A subsequent fine-adjustment is not possible.

It is an object of the invention to provide a superconducting gradiometer for measuring weak magnetic fields, in which the inaccurate position of a gradiometer wire does not cause a misadjustment and error sources such as, for example, the temperature-dependent change in position of the wire, do not affect the adjustment, as well as to provide methods of manufacturing such a gradiometer whose adjustment after it has been manufactured is already better than $10^{-4}$.

This object is achieved according to the present invention by means of a superconducting gradiometer which comprises a non-magnetic carrier body having a surface which is provided with at least one circumferential groove and at least one adjoining axially oriented groove, each groove carrying a superconducting thin film and the circumferential groove accommodating at least one superconducting wire turn and the axially oriented groove accommodating a superconducting connection wire, both the wire turn and the wire being accommodated completely and electrically contact-free, the circumferential thin film being interrupted; further, a method of manufacturing such a superconducting gradiometer is characterized in that at least one accurately dimensioned circumferential groove and at least one further groove extending orthogonally thereto are cut in a non-metallic carrier body, that the surface and each groove are coated with a superconducting thin film over the entire surface area, that the superconducting thin film on the surface and at the location of a slit in each circumferential groove are removed and, subsequently, an insulated superconducting wire comprising at least one turn per circumferential groove is introduced and fixed in the grooves; in addition, a further method is characterized in that a lacquer layer is applied to the surface of a non-metallic carrier body, after which at least one accurately dimensioned circumferential groove and at least one further groove which extends orthogonally thereto are cut in the surface, that the surface and each groove are coated with a superconducting thin film over the entire surface area, that the superconducting thin film on the lacquered surface is removed from each circumferential groove by immersion in a solvent for the lacquer, that the superconducting thin film is removed from a slit in each circumferential groove, and subsequently an insulated superconducting wire comprising at least one turn being introduced and fixed in the grooves.

The superconducting gradiometer according to the invention is obtained partly by means of the thin film technology and partly by using a superconducting wire. This enables an excellent adjustment typical of thin-film gradiometers to be attained. A non-magnetic cylindrical substrate is used as the carrier body. The surface of the carrier body advantageously comprises V-shaped grooves extending partially about the carrier body and partially perpendicularly to said circumferential groove(s). The grooves, i.e. at least one circumferential groove and one groove extending orthogonally thereto carry a superconducting thin film which is interrupted each time by a narrow slit in the circular circumferential grooves so that no closed superconducting circuits are formed. A superconducting insulated wire is disposed in the grooves. The wire is fully accommodated in each groove. The wire may be disposed in a twisted manner in the non-circumferential groove which serves to establish the connection. When the wire turns are provided in a number of planes, they are connected in series. Further turns which are partly wound in an opposite direction are arranged subsequent to the turn nearest to the substrate to be investigated and may be followed by a further turn which is wound in the same direction as the first turn. The turn facing the object to be investigated is the detection coil, and the other coils serve as compensation coils. Such a superconducting gradiometer has an adjustment better than $10^{-4}$.

Such gradiometers according to the invention can further be assembled into multichannel measuring devices.

An inventive method of manufacturing such a superconducting gradiometer is obtained in a very simple manner in that the surface of a cylindrical non-magnetic carrier body is provided with grooves. The grooves extend partly circularly about the carrier so as to accommodate the circular turns, and are partly arranged perpendicularly to the above grooves so as to accommodate the connection wires between the individual coil turns. Advantageously, the grooves are V-shaped and have a depth such that the superconducting wire can be completely accommodated therein. Subsequently, the surface of the carrier body, in which the grooves are formed, is fully coated with a superconducting thin film. Known coating methods may be used for this purpose. Subsequently, the superconducting thin film is removed from the surface of the carrier body by means of, for example, a polishing device, thus leaving the thin film only in the grooves. Next, the thin film is interrupted once in the circular circumferential grooves by a very narrow slit so that no closed superconducting circuits remain. This can be carried out by means of, for example, a trimming laser. Finally, the insulated superconducting wire is introduced and fixed in the grooves. Advantageously, both superconducting wires are twisted in the longer perpendicularly extending connection grooves.

A further inventive method of manufacturing a superconducting gradiometer according to the invention is obtained in a simple manner in that a thin lacquer layer as used in, for example, photolithography techniques is first applied to the surface of a cylindrical carrier body. The cutting of the grooves and the coating of the entire surface with a superconducting thin film does not take place until the lacquer layer has been applied. Subsequently, the carrier body is immersed in a liquid which dissolves the lacquer present below the superconducting coating, so that the superconducting thin film is removed only from the surface of the carrier body and not from the grooves. The thin film is further interrupted once by a very narrow slit in the circular circumferential grooves, so that no closed superconducting circuits remain. As described with respect to the above mentioned method this can be carried out by means of, for example, a trimming laser. As in the method mentioned above, the insulated superconducting wire is subsequently introduced and fixed in the grooves.

By means of the above-mentioned method according to the invention, a superconducting gradiometer according to the invention is obtained, in which the magnetic flux to be measured is guided essentially by the superconducting thin film. Magnetic fields cannot pass through a superconductor and, consequently, must be led around the thin film in the grooves. Since the grooves substantially surround the wire, the resulting field-strength distribution is determined by the position and arrangement of the grooves and not by the position of the wire. However, the grooves can be cut very accurately without particular technical expenditure and, moreover, remain dimensionally stable during cooling, so that the desirable adjustment is already obtained in the manufacturing process. In the perpendicularly extending connection grooves the thin film prevents the magnetic flux from penetrating between the twisted wires. Thus, an adjustment of the gradiometer better than $10^{-4}$ is obtained immediately after the manufacture and without further adjustment operations. Moreover, the screening of the twisted connection wires leads to a reduction of the disturbing inductance of these wires. Since the wire extends completely inside the grooves, a small change in its position caused by, for example, temperature influences cannot affect the adjustment. Nevertheless, if necessary, a subsequent fine adjustment is possible in that the superconducting surfaces in the grooves are formed later using a trimming laser.

Figure 3:
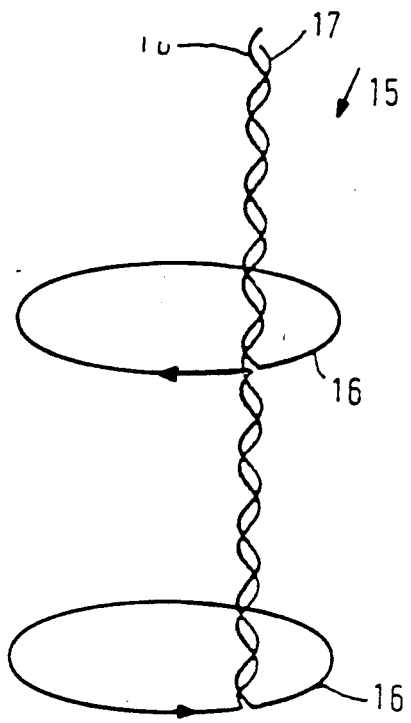
Figure 2:
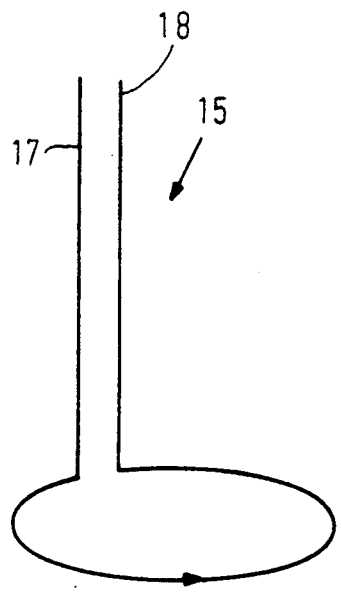
Figure 4:
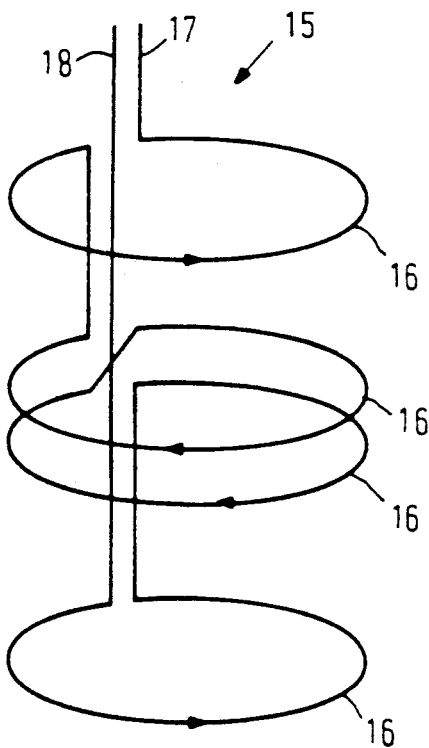

The invention will be explained in greater detail by means of an exemplary embodiment and with reference to the accompanying drawing in which FIG. 1 is an isometric view of a non-magnetic cylindrical carrier body of a gradiometer having two circumferential grooves and one groove extending orthogonally thereto, FIG. 2 is an isometric view of a superconducting insulated wire having one turn, FIG. 3 is an isometric view of a superconducting insulated wire having two turns which are wound in opposite directions and twisted connection wires for the carrier body shown in FIG. 1, and FIG. 4 is an isometric view of a superconducting insulated wire having a number of turns, two centrally arranged turns being wound in opposite directions relative to the outer turns.

FIG. 1 shows a non-magnetic cylindrical carrier body 10, for example, of a workable ceramic material. Two circumferential grooves 11 and one groove 12 extending orthogonally thereto are cut in the carrier body 10, the groove 12 establishing the connection between the circumferential grooves 11 and to a coupling coil which is not shown. Preferably, the groove 12 is axially oriented and arranged on the surface of the carrier body 10. Each groove 11, 12 according to the invention has a superconducting thin film 13 on its surface. The thin film 13 is also initially applied to the exterior surface of the carrier body 10 and to the grooves by means of a known coating method such as, for example, electron beam evaportion or high frequency sputtering. The thin film 13 is removed from the exterior surface using, for example, a polishing device, so that the superconducting thin film 13 remains only in each groove 11, 12. In each circumferential groove 11, the superconducting thin film 13 is interrupted once by a narrow slit 14, so that no closed superconducting circuits remain. The slits 14 can be formed in the circumferential grooves 11 by means of, for example, a trimming laser.

The carrier body 10 of the gradiometer according to the invention can be alternatively manufactured by applying a thin lacquer layer (not shown), as used in for example photolithography, to the surface of the cylindrical carrier body 10. Subsequently, the grooves 11 and 12 are cut and the surface is fully coated with a superconducting thin film 13, as described hereinabove. Next, the carrier can be immersed in a solvent to remove the lacquer, so that the superconducting thin film 13 remains only in the grooves 11, 12. The superconducting thin film 13 is to be interrupted once in each circumferential groove 11 by a narrow slit 14. This can also be carried out by using a trimming laser.

Advantageously, each groove 11, 12 has a V-shaped cross-section and is formed in the carrier body 10 with such a depth that a superconducting wire 15 (FIG. 3) can be fully accommodated therein. Niobium or niobium nitride can for example be used as the superconducting thin film 13. The superconducting wire 15 which is wound in two turns, as shown in FIG. 3, is disposed in the grooves 11, 12 and fixed therein using, for example, an adhesive. The wire may have a typical diameter of 0.1 mm.

After the superconducting wire 15, which is additionally insulated, is fixed in the grooves 11, 12, a gradiometer according to the invention is obtained in which the magnetic flux to be measured is essentially guided by the superconducting thin film in the grooves 11, 12. The grooves 11, 12 can be cut very accurately in a simple manner, so that a desirable adjustment better than $10^{-4}$ is obtained already after the manufacture. This can be attributed to the fact that magnetic fields cannot pass through a superconductor and, consequently, are led around the thin film in the grooves 11, 12, so that the resulting field strength distribution is determined only by the grooves 11, 12. Misadjustments caused by the wire 15 in the connection groove 12 are also precluded by the thin film 13 in groove 12. By virtue of this screening of the twisted wire 15 a reduction of the disturbing inductance of these wires is additionally obtained. Moreover, the gradiometer according to the invention is also very suitable for a subsequent fine adjustment because the superconducting surfaces in the grooves 11, 12 are readily accessible to a trimming laser and, hence, can be provided with a slit 14 in a simple manner.

FIG. 2 shows the principal arrangement of a superconducting wire 15 having only one turn 16 and two connection wires 17, 18 which lead to a coupling coil which is not shown and which acts on a SQUID which is not shown. For this purpose a suitable carrier body 10 needs only one circumferential groove 11. The arrow indicates the direction of winding.

FIG. 3 shows a superconducting wire 15' which is suitable for the carrier body 10 as shown in FIG. 1 and which comprises two parallel arranged turns 16 which are located at a distance from each other and which are wound in opposite directions (see arrows), the turns being series connected through twisted connection wires 17', 18' and connected to the coupling coil which is not shown. The turn 16 shown at the lower end of FIG. 3 essentially forms the detection coil.

FIG. 4 shows a principal construction of a superconducting wire 15" having four turns 16', 16", 16''' and 16'''' which are series connected to the coupling coil, not shown, through connection wires 17", 18". In this arrangement of the wire 15", the two central turns 16" and 16''' are arranged in a central circumferential groove 11 which is not shown in FIG. 1, and the turn 16'''' shown at the lower end of FIG. 4 is arranged in a lower circumferential groove 11, and the upper turn 16' shown in FIG. 4 is arranged in an upper circumferential groove 11. The lower turn 16'''' serves as a detection coil for the magnetic field to be detected and the other turns 16" and 16'''' serve as compensation coils. Moreover, the central turns are wound in an opposite direction (see arrows) relative to the other turns.

The components of the superconducting gradiometer according to the invention which are shown only by way of example in FIGS. 1 up to and including 4, are connected to a coupling coil and a SQUID, both not shown, and are incorporated in a cryosystem, not shown, together with these elements.

The various embodiments of the features of the invention disclosed in the preceding description, in FIGS. 1, 2, 3 and 4 as well as in the claims can be of essential importance both individually and in any combination to the realisation of the invention.

What is claimed is:

1. A superconducting gradiometer for detecting weak magnetic fields for a measuring device comprising a coupling coil which is connected to the gradiometer, a SQUID in a cryosystem and a signal processing device, said gradiometer comprising a non-magnetic carrier body having a surface which is provided with at least one circumferential groove and at least one adjoining axially oriented groove, each groove carrying a superconducting thin film, said circumferential groove accommodating at least one superconducting wire turn, said axially oriented groove accommodating a superconducting connection wire, both the wire turn and the connection wire being fully accommodated in said groove in an electrically contact-free manner, said circumferential thin film being interrupted.

2. A gradiometer as claimed in claim 1, wherein the superconducting wire is insulated and a number of circumferential grooves are parallel arranged at a distance from each other, each circumferential groove accommodating at least one wire turn and being series connected through the axial groove.

3. A gradiometer as claimed in claim 2 wherein each wire turn and the connection wires are secured in fixed relation in the respective groove, and that the connection wires are twisted and adapted for coupling to said coupling coil.

4. A gradiometer as claimed in claim 3, wherein said body comprises a cylindrical silicon crystal.

5. A gradiometer as claimed in claim 4 wherein each groove has a V-shaped cross-section and is coated with a superconducting thin film of one of the group consisting of niobium and niobium nitride, and that the circumferential grooves exhibit an uncoated slit.

6. A method of manufacturing a gradiometer for detecting weak magnetic fields for a measuring device comprising a coupling coil connected to the gradiometer, a SQUID in a cryosystem and a signal processing device said method comprising forming at least one accurately dimensioned, circumferential groove and at least one further groove extending orthogonally thereto in the surface of a non-metallic carrier body, coating the surface and each groove with a superconducting thin film, forming a slit in each circumferential groove, removing the superconducting thin film from the surface of the body and in the slit in each circumferential groove, and subsequently securing an insulated wire having at least one turn per circumferential groove in the grooves.

7. A method of manufacturing a gradiometer for detecting weak magnetic fields for a measuring device comprising a coupling coil connected to the gradiometer, a SQUID in a cryosystem and a processing device, said method comprising applying a lacquer layer to the surface of a non-metallic carrier body, forming in said lacquered surface at least one circumferential groove and at least one further groove extending orthogonally thereto, coating the surface and each groove with a superconducting thin film, removing the superconducting thin film on the lacquered surface by immersion in a solvent for the lacquer, forming a transverse slit in each circumferential groove for removing the superconducting thin film at the location of the slit, after which securing an insulated superconducting wire having at least one turn per circumferential groove.

8. A method as claimed in one of claims 6 or 7 including cutting each groove to such a depth that the respective corresponding superconducting wire is fully accommodated therein.

9. A method as claimed in claim 8 including coating by one of electron beam evaporation and sputtering the surface and each groove with one of niobium and niobium nitride.

10. A method as claimed in claim 9, including removing the thin film on the surface of the carrier body (10) by polishing.

11. A method as claimed in claim 10 including lasing a slit in the thin film to interrupt the film at the location of the slit in each circumferential groove.

12. The method of claim 11 including forming a plurality of said circumferential grooves in said body, forming said wire into a twisted pair including at least one intermediate wire loop and an end loop connected by said twisted pair, the winding of said end loop being in opposite direction to the winding of said intermediate loop, and securing said loops in respective different ones of said circumferential grooves and said twisted pair in said further orthogonally extending groove, an end of the twisted pair opposite said end loop for connection to said coupling coil.

13. The method of claim 12 including altering the dimensions of the superconducting surfaces in said grooves.

* * * * *